United States Patent
Nallapati et al.

(10) Patent No.: US 7,867,858 B2
(45) Date of Patent: Jan. 11, 2011

(54) HYBRID TRANSISTOR BASED POWER GATING SWITCH CIRCUIT AND METHOD

(75) Inventors: Giri Nallapati, Austin, TX (US); Sushama Davar, Austin, TX (US); Robert E. Booth, Austin, TX (US); Michael P. Woo, Austin, TX (US); Mahbub M. Rashed, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 390 days.

(21) Appl. No.: 12/059,006

(22) Filed: Mar. 31, 2008

(65) Prior Publication Data

US 2009/0242994 A1  Oct. 1, 2009

(51) Int. Cl.
*H01L 21/8234* (2006.01)
(52) U.S. Cl. .................. 438/275; 438/276; 438/301; 326/33; 326/121; 257/E21.616
(58) Field of Classification Search ............. 438/275, 438/276, 301; 326/33, 121
See application file for complete search history.

(56) References Cited

U.S. PATENT DOCUMENTS

| | | | |
|---|---|---|---|
| 5,811,962 A * | 9/1998 | Ceccherelli et al. | 323/282 |
| 5,841,269 A * | 11/1998 | Schoonmaker et al. | 323/276 |
| 6,876,595 B2 * | 4/2005 | Bhavnagarwala et al. | 365/230.03 |
| 6,883,152 B2 | 4/2005 | Bednar et al. | |
| 7,088,131 B1 | 8/2006 | Stout et al. | |
| 2002/0003439 A1 | 1/2002 | Asano et al. | |
| 2002/0041524 A1 | 4/2002 | Takahashi et al. | |
| 2002/0130685 A1 * | 9/2002 | Forbes | 326/98 |

OTHER PUBLICATIONS

PCT Search Report and Written Opinion, PCT/US2009/033195, mailed Aug. 27, 2009.

* cited by examiner

*Primary Examiner*—Alexander G Ghyka
(74) *Attorney, Agent, or Firm*—Daniel D. Hill; James L. Clingan, Jr.

(57) ABSTRACT

A method includes forming a first transistor having a first gate dielectric thickness and a first source/drain extension depth, a second transistor having a second gate dielectric thickness and the first source/drain extension depth, and a third transistor having the second gate dielectric thickness and a second source/drain extension depth. The second source/drain extension depth is greater than the first source/drain extension depth. The second gate dielectric thickness is greater than the first gate dielectric thickness. The first transistor is used in a logic circuit. The third transistor is used in an I/O circuit. The second transistor is made without extra processing steps and is better than either the first or third transistor for coupling a power supply terminal to the logic circuit in a power-up mode and decoupling the power supply terminal from the logic circuit in a power-down mode.

18 Claims, 7 Drawing Sheets

HYBRID TRANSISTOR BASED POWER GATING SWITCH CIRCUIT AND METHOD

BACKGROUND

1. Field

This disclosure relates generally to integrated circuits, and more specifically, to a hybrid transistor based power gating switch circuit and method.

2. Related Art

Switch circuits constitute a considerable portion of today's low power integrated circuits in order to reduce chip leakage power. More and more logic circuitry, memories and integrated circuit cores are now gated by different types of switch circuits, wherein the switch circuits could make up to five percent (5%) of total chip area. For 65 nm technology, a common switch transistor includes a logic low power (LP) PMOS transistor (also referred to as a "header" transistor) or a logic LP NMOS transistor (also referred to as a "footer" transistor); however, in 45 nm technology, due to oxide thickness reduction and increased gate leakage, as well as gate induced drain leakage (GIDL), the use of the core logic transistor as a switch has become more difficult. In particular, the gate and GIDL leakage of the core logic transistor exceeds the acceptable leakage budget for switch usage.

An alternative to the core logic transistor as a switch is an input/output (IO) transistor due to its thicker oxide which can allow for significantly less gate and GIDL leakage. However, while the leakage of the IO transistor as a switch is not a problem, the use of the IO transistor as a switch disadvantageously results in an undesirably significant area increase due to thick gate oxide design rules of the IO transistor, as well as lower transistor performance as compared to the core logic transistor.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

According to one embodiment of the present disclosure, a hybrid switch transistor is formed with dielectric layer thickness on the order of an IO transistor dielectric thickness and includes an extension and halo implant of a logic transistor. With the IO transistor dielectric thickness and the logic transistor extension and halo implant, the hybrid switch transistor advantageously provides an improved IO transistor short channel margin, thereby allowing the gate length (Lpoly) for the switch transistor to be on the order of fifty percent (50%) of an IO transistor gate length. The embodiments of the present disclosure are advantageously accomplished by a Boolean technique, without any new masks. In addition, transistor design rules can be changed since the hybrid switch transistor operates between cut-off mode and linear mode, and not in saturation mode.

The hybrid switch transistor according to the embodiments of the present disclosure provides an excellent candidate for a switch application by providing the best of both logic and IO transistor options. In other words, the hybrid switch transistor advantageously provides for considerable reduction in leakage from a logic transistor based switch and advantageously reduces the resultant switch area by at least two times (2×), which could be between 0.5 mm$^2$ to 1 mm$^2$ for deep sub-micron semiconductor technologies.

According to another embodiment, the hybrid transistor based switch circuit reduces switch area and leakage current while making switch leakage independent of core transistor variations. In one embodiment, the hybrid transistor based switch circuit reduces the total switch size by on the order of about two times (2×) and transistor leakage by on the order of four times (4×) with respect to a current known 45 nm technology switch option. In addition, the embodiments of the present disclosure can be realized via Boolean techniques without additional process steps.

Accordingly, the embodiments of the present disclosure provide for a viable area and leakage friendly solution for a switch circuit in products manufactured using deep sub-micron (45 nm and beyond) technologies. The embodiments further do not consume considerable die area. Furthermore, the hybrid switch transistor of the present disclosure provides a unique no cost solution (i.e., using Boolean techniques, as discussed herein) that cuts down on required area by two times (2×) and leakage by four times (4×) when compared to current known 45 nm technology.

In one embodiment, the voltage supply includes a 1.8V supply. Other embodiments may include use of a 1.1V level supply. In addition, one benefit with a hybrid transistor NMOS footer switch implementation of the present disclosure is that it is less process dependent due to considerable lower gate induced drain leakage (GIDL) and it will be independent of core transistor modulation during process optimization. In addition, the hybrid transistor can be adjusted via different options using Boolean techniques: NSVTLP (standard threshold voltage NMOS low power) Halo/extension; NLVTLP (low threshold voltage NMOS low power) Halo/extension; NMOS SRAM cell implant halo.

FIGS. 1-12 are partial cross-sectional views of a semiconductor device 10 including a hybrid transistor based power gating switch during various steps of manufacture thereof according to one embodiment of the present disclosure. In particular, in FIG. 1, the semiconductor device 10 includes a substrate 12 which can be portioned into several regions, a logic transistor device region generally indicated by reference numeral 14, a hybrid switch transistor device region generally indicated by reference numeral 16, and an input/output (IO) transistor device region generally indicated by reference numeral 18. The semiconductor substrate 12 described herein can be any semiconductor material or combinations of materials, such as gallium arsenide, gallium nitride, silicon germanium, silicon-on-insulator (SOI), silicon, monocrystalline silicon, the like, and combinations of the above. In one embodiment, substrate 12 comprises a P-type substrate.

Figure 1:
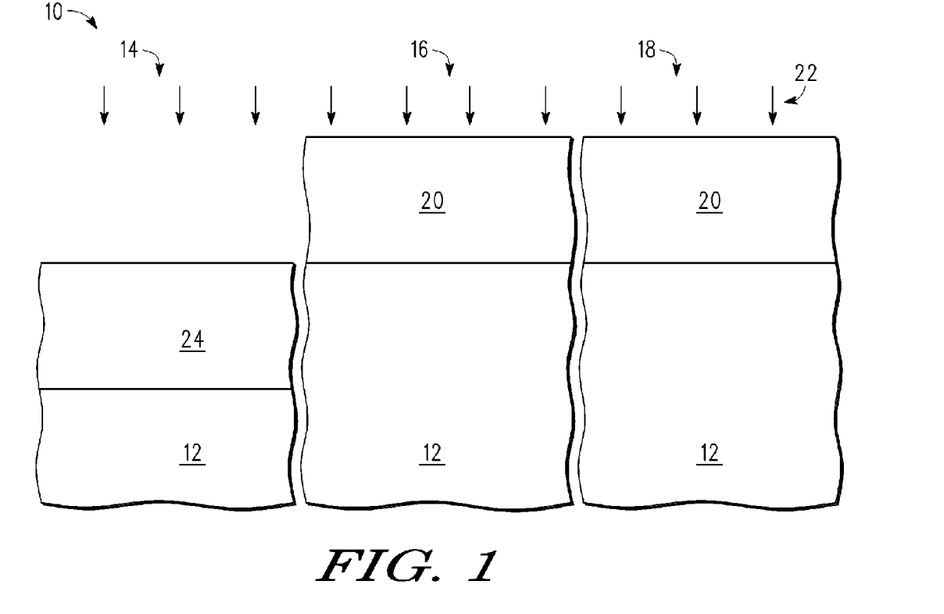
FIGS. 1-12 are partial cross-sectional views of a semiconductor device including a hybrid transistor based power gating switch during various steps of manufacture thereof according to one embodiment of the present disclosure.

A mask 20 is formed overlying substrate 12 as shown in FIG. 1. Mask 20 comprises any suitable photoresist having been patterned according to techniques known in the art. In particular, mask 20 is patterned to expose the substrate 12 in the logic transistor device region 14, while remaining overlying the substrate 12 in the hybrid switch transistor region 16 and the IO transistor region 18. Semiconductor device 10 is subjected to a first implant 22. The first implant 22 comprises a logic transistor well implant and is configured to form a well implant region 24 in the logic device region 14 of substrate 12. In one embodiment, the first implant 22 comprises an P-type implant having a dopant concentration configured according to the requirements of a given logic transistor device.

Figure 2:
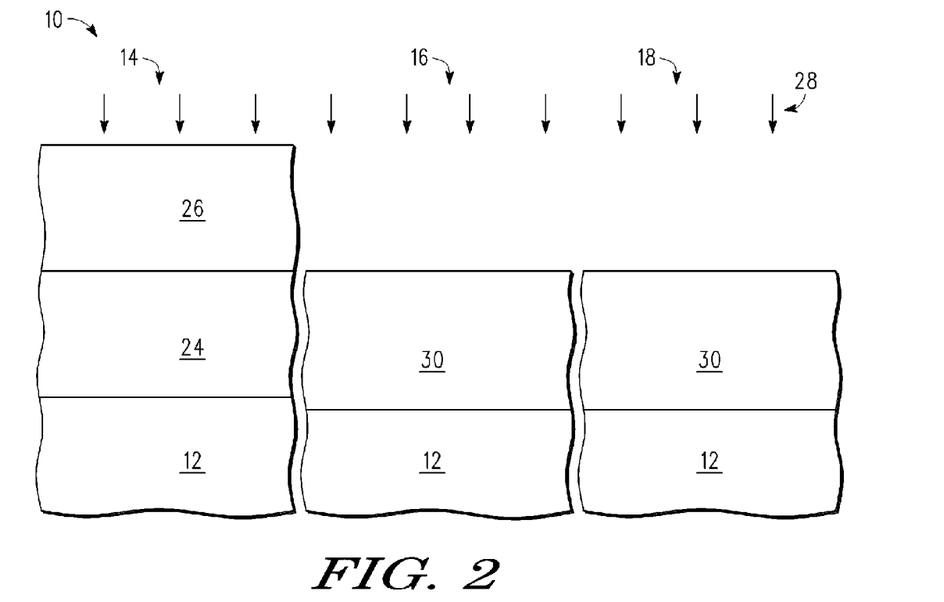

Turning now to FIG. 2, mask 20 of FIG. 1 is removed and a mask 26 is formed overlying substrate 12. Mask 26 comprises any suitable photoresist having been patterned according to techniques known in the art. In particular, mask 26 is patterned to expose the substrate 12 in the hybrid switch transistor region 16 and the IO transistor region 18, while remaining overlying the substrate 12 in the logic transistor device region 14. Semiconductor device 10 is subjected to a second implant 28. The second implant 28 comprises a hybrid switch and IO transistor well implant and is configured to form a well implant region 30 within substrate 12 in both the hybrid switch transistor region 16 and the IO transistor device region 18. In one embodiment, the second implant 28 comprises a P-type implant having a dopant concentration configured according to the requirements of an IO transistor device in region 18, wherein the dopant concentration is also suitable for a corresponding hybrid switch transistor device in region 16.

Figure 3:
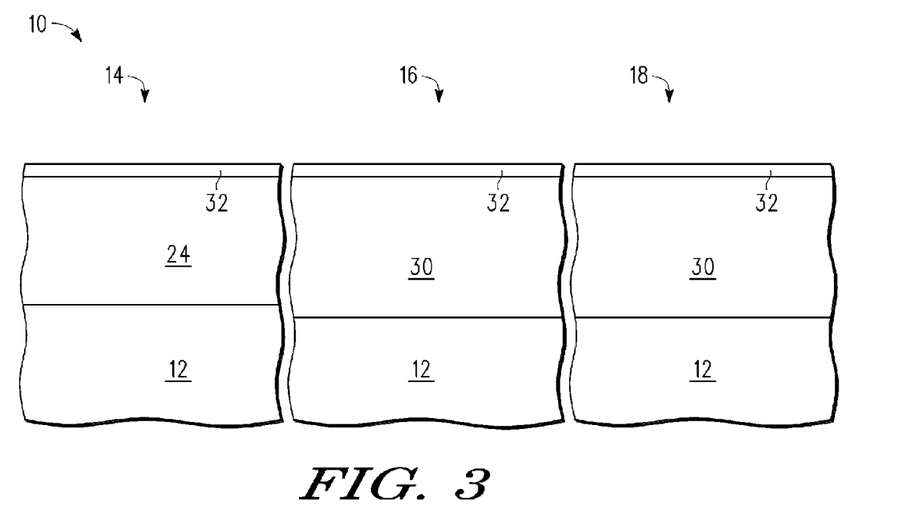

Referring now to FIG. 3, mask 26 of FIG. 2 is removed and a thick dielectric layer 32 is formed overlying the substrate 12. Dielectric layer 32 can comprise any suitable dielectric layer, stack of dielectrics, oxide or oxides, and/or other suitable electrically insulating material(s), whether deposited or grown, and having an overall thickness suitable for use in an IO transistor device to be formed within region 18 and which is also suitable for the corresponding hybrid switch transistor device to be formed within region 16, according to the embodiments of the present disclosure. In one embodiment, dielectric layer 32 has a thickness on the order of 1.5-2.0 nm.

Figure 4:
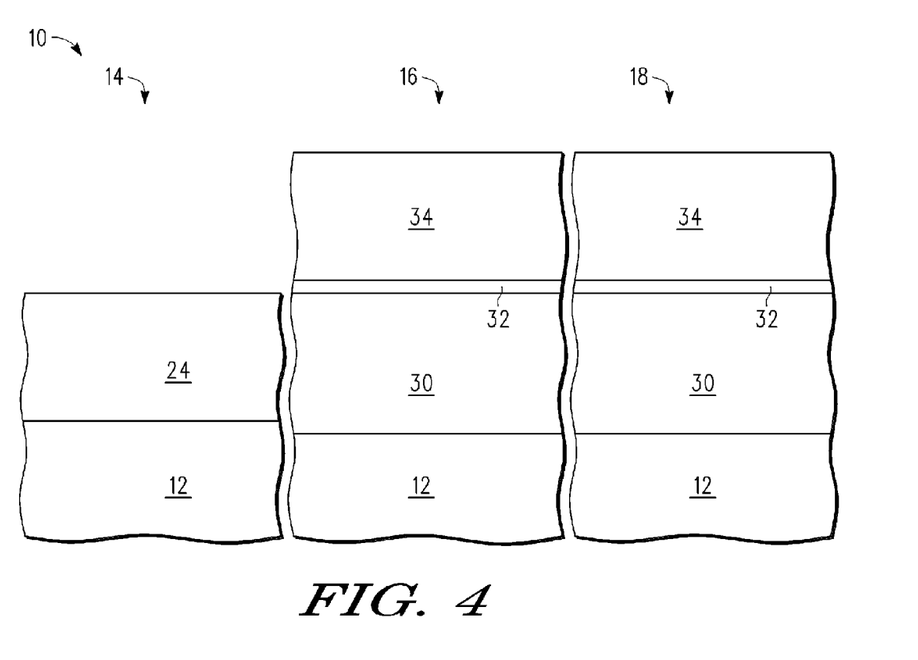

Turning now to FIG. 4, mask 34 is formed overlying dielectric layer 32. Mask 34 comprises any suitable photoresist and is patterned according to techniques known in the art. In particular, mask 34 is patterned to expose the dielectric layer 32 within the logic transistor device region 14, and to enable removal of the dielectric layer 32 overlying substrate 12 within the logic transistor device region 14. Subsequent to removal of the dielectric layer 32 within the logic transistor device region 14, the mask 34 is removed and a thin dielectric layer 36 is formed overlying the substrate 12. Dielectric layer 36 can comprise any suitable dielectric layer, stack of dielectrics, oxide or oxides, and/or other suitable electrically insulating material(s), whether deposited or grown, and having an overall thickness suitable for use in a logic transistor device to be formed within region 14, according to the embodiments of the present disclosure. In one embodiment, dielectric layer 36 has a thickness on the order of 1.2-2.0 nm. Formation of dielectric layer 36 can also result in a thickening of dielectric layer 32, wherein the thickened dielectric layer is represented by reference numeral 33. In one embodiment, dielectric layer 33 has thickness on the order of 3.0-3.5 nm.

Figure 5:
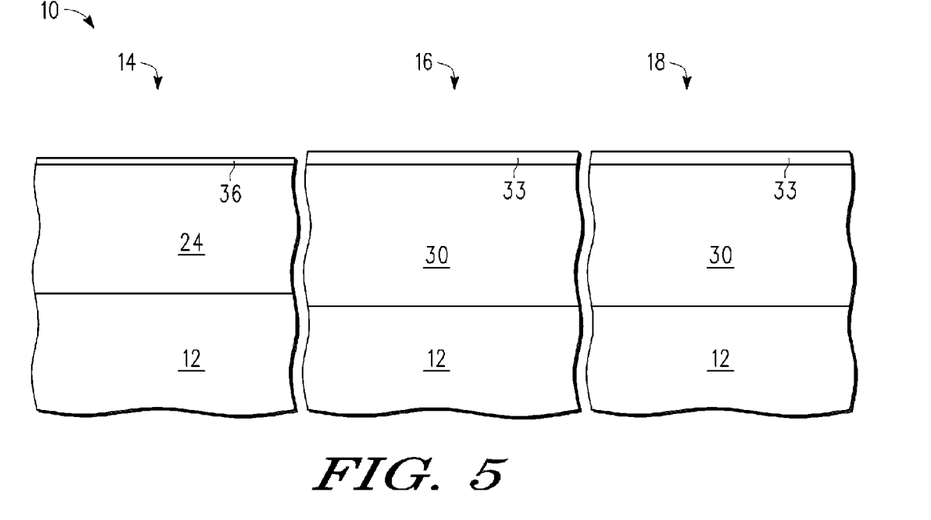
Figure 6:
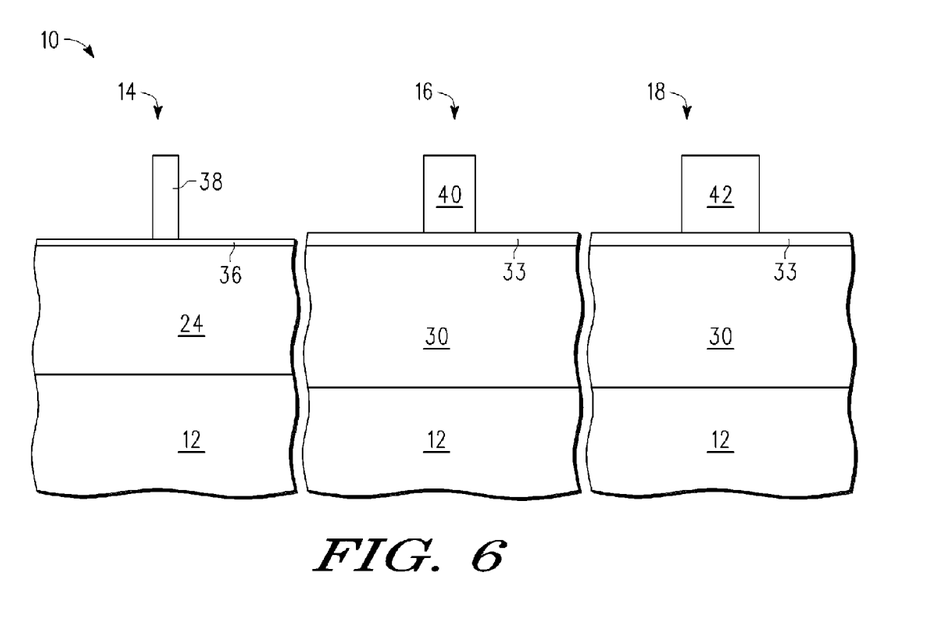

Subsequent to the formation of electrically insulating layer 36, gate stacks 38, 40, and 42 are then formed in the logic transistor device region 14, the hybrid switch transistor device region, and the IO transistor device region, respectively. Gate stack 38 comprises a gate stack suitable for use in a logic transistor device, wherein gate stack 38 includes a first gate length. Gate stack 40 comprises a gate stack suitable for use in a hybrid transistor switch device, wherein gate stack 40 includes a second gate length, wherein the second gate length is on the order of two to three times (2-3×) that of the first gate length. Gate stack 42 comprises a gate stack suitable for use in an IO transistor device, wherein gate stack 42 includes a third gate length, wherein the third gate length is on the order of two times (2×) that of the second gate length, or on the order of four to six times (4-6×) that of the first gate length. The gate stacks 38, 40, and 42 can comprise any suitable gate layer or gate stack for corresponding devices yet to be formed within the respective regions, according to suitable techniques known in the art.

Figure 7:
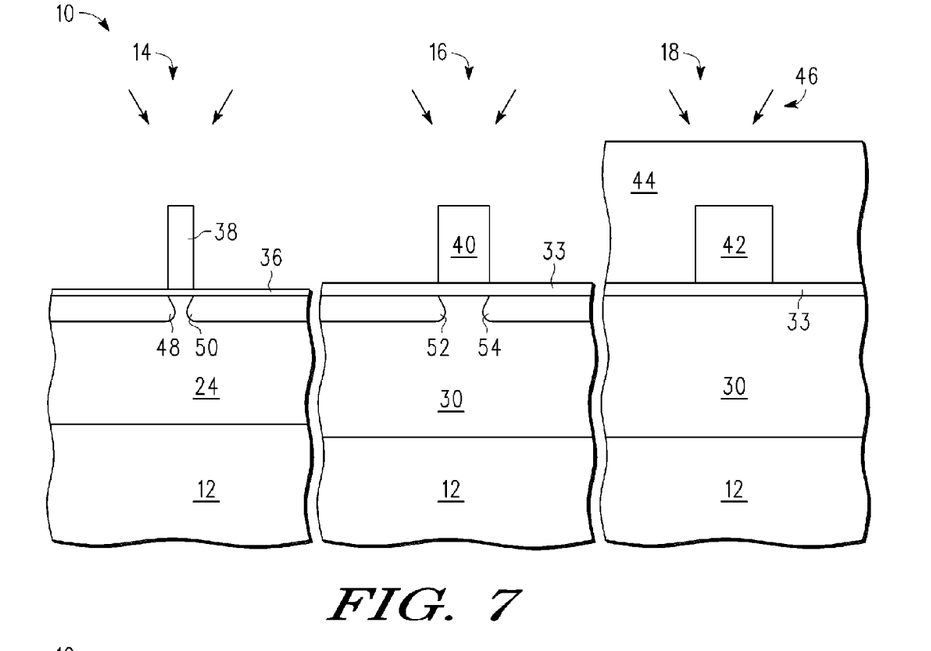

Turning now to FIG. 7, mask 44 is formed overlying dielectric layer 33 and gate stack 42 in the IO transistor device region 18. Mask 44 comprises any suitable photoresist having been patterned according to techniques known in the art. In particular, mask 44 is patterned to expose the dielectric layers 36 and 33 and gates 38 and 40 in the logic transistor device region 14 and hybrid switch transistor region 16, respectively, while remaining overlying the IO transistor region 18. Semiconductor device 10 is subjected to a first halo implant 46. The first halo implant 46 comprises a logic transistor halo implant and is configured to form halo implant regions 48 and 50 within substrate 12 in the logic device region 14 of substrate 12. In addition, the first halo implant 46 is also configured to form halo implant regions 52 and 54 within substrate 12 in the hybrid switch transistor device region 16. In one embodiment, the first halo implant 46 comprises a P-type implant having a dopant concentration configured according to the requirements of a given logic transistor device, wherein the halo implant dopant concentration is also suitable for a corresponding hybrid switch transistor device in region 16.

Figure 8:
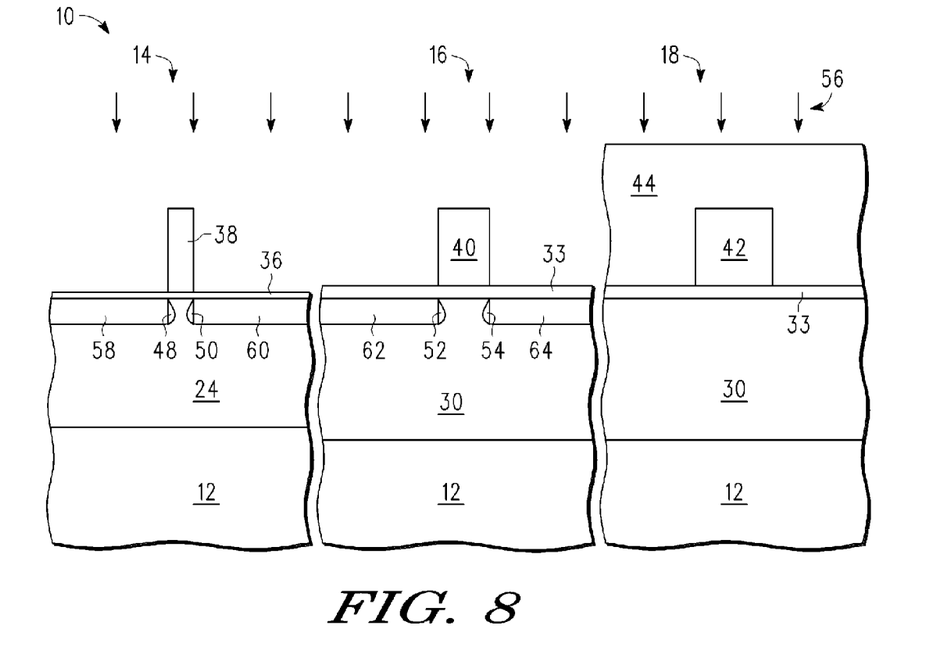

Subsequent to formation of the halo implant regions 48, 50, 52, and 54, semiconductor device 10 is subjected to a first extension implant 56 in FIG. 8. The first extension implant 56 comprises a logic transistor extension implant and is configured to form extension implant regions 58 and 60 within substrate 12 in the logic device region 14 of substrate 12. In addition, the first extension implant 56 is also configured to form extension implant regions 62 and 64 within substrate 12 in the hybrid switch transistor device region 16. In one embodiment, the first extension implant 56 comprises an N-type implant having a dopant concentration configured according to the requirements of a given logic transistor device, wherein the extension implant dopant concentration is also suitable for a corresponding hybrid switch transistor device in region 16.

Figure 9:
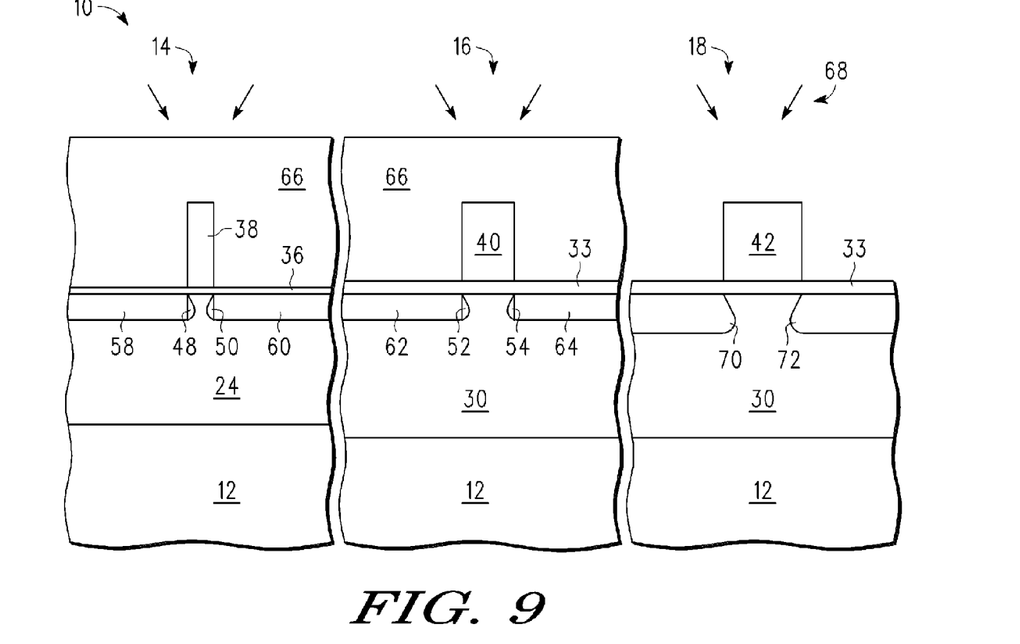

Turning now to FIG. 9, mask 44 of FIG. 8 is removed and mask 66 is formed overlying dielectric layers 36 and 33 and gates 38 and 40 in the logic transistor device region 14 and hybrid switch transistor region 16, respectively. Mask 66 comprises any suitable photoresist having been patterned according to techniques known in the art. In particular, mask 66 is patterned to expose the dielectric layer 33 and gate 42 in the IO transistor region 18, while remaining overlying the logic transistor device region 14 and hybrid switch transistor region 16. Semiconductor device 10 is subjected to a second halo implant 68. The second halo implant 68 comprises an IO transistor halo implant and is configured to form halo implant regions 70 and 72 within substrate 12 in the IO transistor device region 18 of substrate 12. In one embodiment, the second halo implant 68 comprises a P-type implant having a dopant concentration configured according to the requirements of a given IO transistor device.

Figure 10:
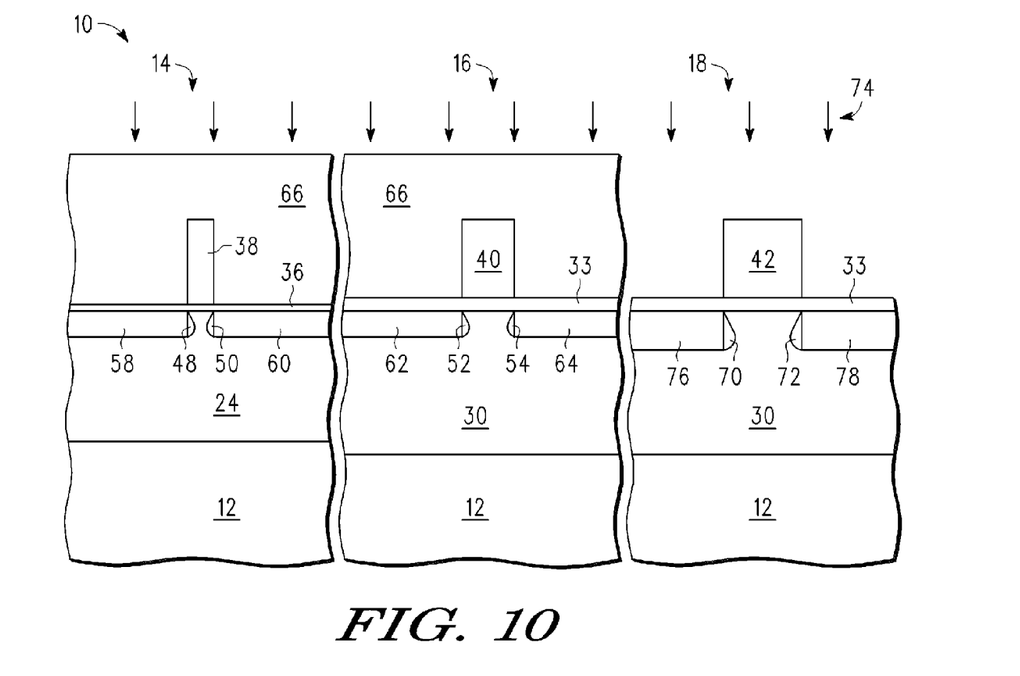

Subsequent to formation of the halo implant regions 70 and 72, semiconductor device 10 is subjected to a second extension implant 74 in FIG. 10. The second extension implant 74 comprises an IO transistor extension implant and is configured to form extension implant regions 76 and 78 within substrate 12 in the IO transistor device region 18 of substrate 12. In one embodiment, the second extension implant 74 comprises an N-type implant having a dopant concentration configured according to the requirements of a given IO transistor device in region 18.

Figure 11:
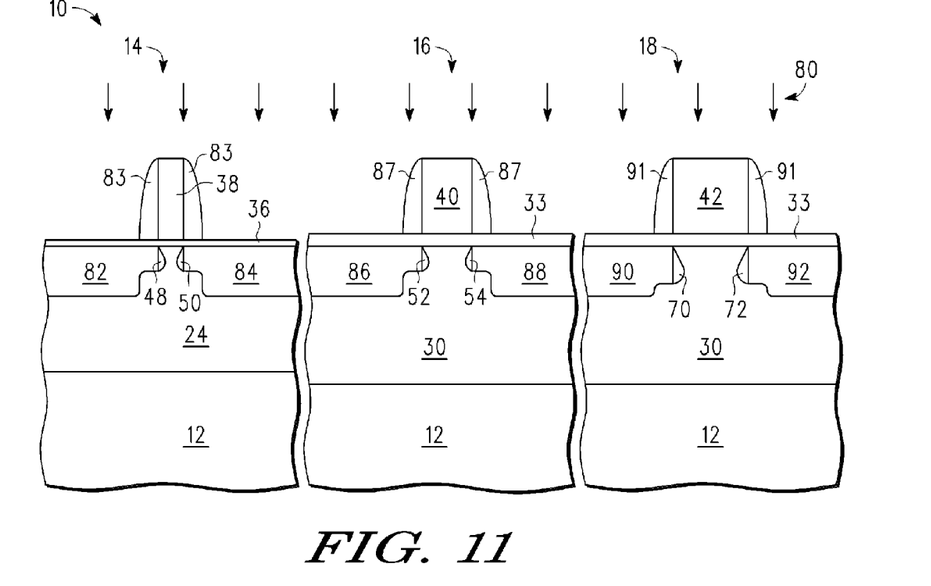

Turning now to FIG. 11, mask 66 of FIG. 10 is removed and sidewall spacers 83, 87 and 91 are formed over corresponding gate stacks 38, 40, and 42, respectively. The sidewall spacers 83, 87 and 91 can be formed using suitable techniques known in the art. Subsequent to formation of the sidewall spacers, semiconductor device 10 is subjected to a source/drain implant 80 and subsequent source/drain activation. The source/drain implant 80 and subsequent activation are configured to form (i) source/drain regions 82 and 84 within substrate 12 in the logic transistor device region 14, (ii) source/drain regions 86 and 88 within substrate 12 in the hybrid switch transistor device region 16, (iii) source/drain regions 90 and 92 within substrate 12 in the IO transistor device region 18 of substrate 12. In one embodiment, the source/drain implant 80 comprises an N-type implant having a dopant concentration configured according to the requirements of given logic transistor device, hybrid transistor switch device, and IO transistor device in regions 14, 16, and 18.

Figure 12:
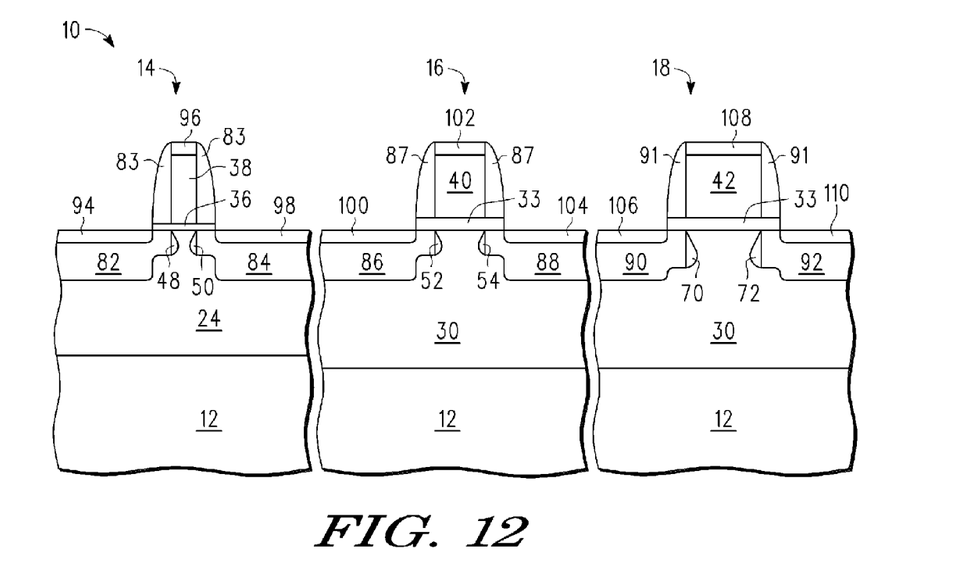

Turning now to FIG. 12, source/drain regions and gate electrodes are silicided using suitable techniques. In particular, source/drain regions 82 and 84 and gate electrode stack 38 of the logic transistor device in region 14 are silicided. Source/drain regions 86 and 88 and gate electrode stack 40 of the hybrid switch transistor device in region 16 are silicided. Source/drain regions 90 and 92 and gate electrode stack 42 of the IO transistor device in region 18 are silicided.

Figure 13:
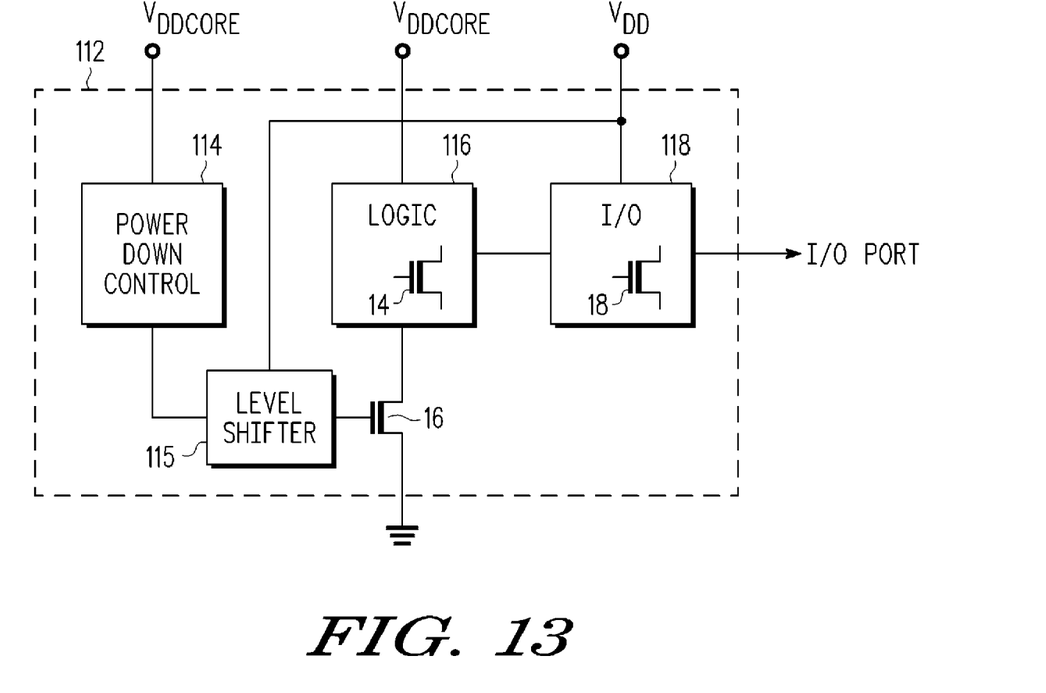
FIG. 13 is a block diagram representation view of a hybrid transistor based power gating switch circuit according to another embodiment of the present disclosure.

FIG. 13 is a block diagram representation view of a hybrid transistor based power gating switch circuit 112 according to another embodiment of the present disclosure. The circuit 112 includes a power down control component 114, a level shifter 115, a logic component 116, an IO component 118, and an at least one hybrid transistor switch device 16, as discussed herein with respect to FIGS. 1-12. The logic component 116 includes at least one logic transistor device 14, as discussed herein with respect to FIGS. 1-12. The IO component includes at least one IO transistor device 18, as discussed herein with respect to FIGS. 1-12.

Power down control component 114 of circuit 112 coupled to $V_{DD\ CORE}$ and provides a high or low output in response to a given circuit power management operation to either power up or power down. In one embodiment, if the power management operation comprises a power up operation, then control component 114 outputs a high signal into level shifter 115, which causes hybrid transistor switch device 16 to become active and couples the ground terminal to the logic circuitry of logic component 116. If logic circuitry is active, i.e., coupled between $V_{DD\ CORE}$ and ground terminals, then IO component 118 operates according to an appropriate input or output for a given IO operation. Responsive to control component 114 outputting a low signal, indicative of a power down operation, wherein the low signal is provided to level shifter 115, then the logic circuitry of logic component 116 is decoupled from the ground terminal via hybrid transistor switch device 16.

By now it should be appreciated that there has been provided a method for making an integrated circuit using a semiconductor substrate and for operating the integrated circuit, comprising: (i) forming a first transistor by forming a first gate over a first region of the substrate and on first gate dielectric having a first thickness and implanting a first source/drain dopant into the first region using the first gate as a mask while masking the third region; (ii) forming a second transistor by forming a second gate over a second region of the substrate and on a second gate dielectric having a second thickness; and implanting the first source/drain dopant into the second region using the second gate as mask while implanting the first source/drain dopant into the first region; (iii) forming a third transistor by forming a third gate over a third region of the substrate and on a third gate dielectric having the second thickness; and (iv) implanting a second source/drain dopant into the third region using the third gate as mask and while masking the first and second regions. The method further includes forming a logic circuit using the first transistor having a connection for coupling to a first power supply terminal; using the second transistor to couple the logic circuit to the first power supply terminal during a power-up mode of the integrated circuit and decouple the logic circuit from the first power supply terminal during a power-down mode of the integrated circuit; and using the third transistor to interface externally to the integrated circuit. In one embodiment, the step of using the second transistor is further characterized by the first power supply terminal comprising ground.

According to another embodiment, the step of implanting the second source/drain dopant is further characterized as being at an energy greater than the energy of the step of implanting the first source/drain dopant and the first source/drain dopant is a same species as the second source/drain dopant.

In another embodiment, the step of forming the first transistor can further comprise implanting a first species, while masking the third region, that is of a different type from the first source/drain dopant in a portion of the first region under a portion the first gate using the first gate as a mask; and the step of forming the second transistor further comprises implanting the first species in a portion of the second region under a portion of the second gate using the second gate as a mask while implanting the first species in the portion of the first region. In addition, the step of forming the third transistor further comprises performing a halo implant in the third region while masking the first and second regions.

In yet another embodiment, the step of forming the first transistor further comprises forming a first sidewall spacer around the first gate and performing a source/drain implant into the first region using the first sidewall spacer as a mask; and the step of forming the second transistor further comprises forming a second sidewall spacer around the second gate and performing the source/drain implant into the second region using the second sidewall spacer as a mask while performing the source/drain implant into the first region. In addition, the step of forming the third transistor further comprises forming a third sidewall spacer around the third gate and performing the source/drain implant into the third region using the third sidewall spacer as a mask while performing the source/drain implant into the first region. The step of forming the first transistor further comprises implanting a first species, while masking the third region, that is of a different type from the first source/drain dopant in a portion of the first region under a portion the first gate using the first gate as a mask; and the step of forming the second transistor further comprises implanting the first species in a portion of the second region under a portion of the second gate using the second gate as a mask while implanting the first species in the portion of the first region.

In another embodiment, the method further comprises forming a first well in the first region to a first depth; forming a second well in the second region to a second depth greater than the first depth; and forming a third well in the third region to the second depth. In a further embodiment, the first gate dielectric is formed by forming an insulating layer over the first, second, and third regions; removing the insulating layer from over the first region while leaving the insulating layer over the second and third region; and forming a dielectric layer on the first region as the first gate dielectric after the step of removing. The method can further include wherein the steps of forming the second and third transistors are further characterized by the second gate dielectric comprising a first portion of both the dielectric layer and the insulating layer and by the third gate dielectric comprising a second portion of both the dielectric layer and the insulating layer.

In one embodiment, a method for making an integrated circuit using a semiconductor substrate and for operating the integrated circuit, comprises forming a first dielectric layer over a first region of the substrate; forming a second dielectric layer over a second region and third region of the substrate, wherein the second dielectric layer is thicker than the first dielectric layer; forming a first gate over the first region and on the first dielectric layer; forming a second gate over the second region and on the second dielectric layer; forming a third gate over the third region and on the second dielectric layer; and masking the third region. A first source/drain extension implant is performed into the first region and the second region while masking the third region. The first region and the second region are masked and a second source/drain extension implant is performed into the third region while the first region and the second region are masked. The method further includes completing forming a first transistor that includes the first gate, a second transistor that includes the second gate, and a third transistor that includes the third gate; forming a logic circuit using the first transistor having a connection to a first power supply terminal; using the second transistor to couple the logic circuit to the first power supply terminal during a power-up mode of the integrated circuit and decouple the logic circuit from the first power supply terminal during a power-down mode of the integrated circuit; and using the third transistor to interface externally to the integrated circuit.

In another embodiment, the method further comprises masking the third region; and performing a first halo implant on the first and second regions while masking the third region. The method further comprises performing a second halo implant on the third region while masking the first and second regions. In one embodiment, the step of performing the second halo implant is further characterized as being performed at an energy different from that in the step of performing the first halo implant. In a yet further embodiment, the step of performing the second source/drain extension implant is further characterized as being performed at a higher energy than the first source/drain extension implant. The method further comprises masking the second and third regions; performing a first well implant into the first region while masking the second and third regions; masking the first region; and performing a second well implant into the second and third regions while masking the first region. Still further, the method further comprises simultaneously performing a source/drain implant into the first, second, and third regions using the first gate, second gate, and third gate as masks.

According to yet another embodiment, an integrated circuit comprises a first transistor having a first gate dielectric having a first thickness and source/drain regions immediately adjacent to a channel of the first transistor having a first depth; a second transistor having a gate dielectric having a second thickness and source/drain regions immediately adjacent to a channel of the second transistor having the first depth; a third transistor having a gate dielectric having the second thickness and source/drain regions immediately adjacent to a channel of the third transistor having a second depth, wherein: the second thickness is greater than the first thickness; and the second depth is greater than the first depth. In this embodiment, a logic circuit is configured to perform a logic function using the first transistor, wherein the logic circuit has a node for being coupled to a power supply terminal; a power down control circuit is provided having an output, wherein the second transistor has a gate coupled to the output of the power down control circuit, a first current electrode is coupled to the node of the logic circuit, and a second current electrode is coupled to the power supply terminal; and an input/output circuit that includes the third transistor, wherein the input/output circuit is configured to provide an external interface of the integrated circuit. The integrated circuit is further characterized by, wherein: the first transistor has a halo region having a first depth; the second transistor has a halo region having the first depth; and the third transistor has a halo region having a second depth.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making an integrated circuit using a semiconductor substrate and for operating the integrated circuit, comprising:
forming a first transistor by:
forming a first gate over a first region of the substrate and on first gate dielectric having a first thickness; and
implanting a first source/drain dopant into the first region using the first gate as a mask while masking the first region;
forming a second transistor by:
forming a second gate over a second region of the substrate and on a second gate dielectric having a second thickness; and
implanting the first source/drain dopant into the second region using the second gate as mask while implanting the first source/drain dopant into the first region;
forming a third transistor by:
forming a third gate over a third region of the substrate and on a third gate dielectric having the second thickness; and
implanting a second source/drain dopant into the third region using the third gate as mask and while masking the first and second regions;
forming a logic circuit using the first transistor having a connection for coupling to a first power supply terminal;
using the second transistor to couple the logic circuit to the first power supply terminal during a power-up mode of the integrated circuit and decouple the logic circuit from the first power supply terminal during a power-down mode of the integrated circuit; and
using the third transistor to interface externally to the integrated circuit.

2. The method of claim 1 wherein the step of implanting the second source/drain dopant is further characterized as being at an energy greater than an energy of the step of implanting the first source/drain dopant and the first source/drain dopant is a same species as the second source/drain dopant.

3. The method of claim 1 wherein:
the step of forming the first transistor further comprises implanting a first species, while masking the third region, that is of a different type from the first source/drain dopant in a portion of the first region under a portion the first gate using the first gate as a mask; and
the step of forming the second transistor further comprises implanting the first species in a portion of the second region under a portion of the second gate using the second gate as a mask while implanting the first species in the portion of the first region.

4. The method of claim 3, wherein the step of forming the third transistor further comprises performing a halo implant in the third region while masking the first and second regions.

5. The method of claim 1, wherein the step of using the second transistor is further characterized by the first power supply terminal comprising ground.

6. The method of claim 1, wherein:
the step of forming the first transistor further comprises forming a first sidewall spacer around the first gate and performing a source/drain implant into the first region using the first sidewall spacer as a mask; and
the step of forming the second transistor further comprises forming a second sidewall spacer around the second gate and performing the source/drain implant into the second region using the second sidewall spacer as a mask while performing the source/drain implant into the first region.

7. The method of claim 6, wherein the step of forming the third transistor further comprises forming a third sidewall spacer around the third gate and performing the source/drain implant into the third region using the third sidewall spacer as a mask while performing the source/drain implant into the first region.

8. The method of claim 7, wherein:
the step of forming the first transistor further comprises implanting a first species, while masking the third region, that is of a different type from the first source/drain dopant in a portion of the first region under a portion the first gate using the first gate as a mask; and
the step of forming the second transistor further comprises implanting the first species in a portion of the second region under a portion of the second gate using the second gate as a mask while implanting the first species in the portion of the first region.

9. The method of claim 1, further comprising:
forming a first well in the first region to a first depth;
forming a second well in the second region to a second depth greater than the first depth; and
forming a third well in the third region to the second depth.

10. The method of claim 1, wherein the first gate dielectric is formed by:
forming an insulating layer over the first, second, and third regions;
removing the insulating layer from over the first region while leaving the insulating layer over the second and third region; and
forming a dielectric layer on the first region as the first gate dielectric after the step of removing.

11. The method of claim 10, wherein the steps of forming the second and third transistors are further characterized by the second gate dielectric comprising a first portion of both the dielectric layer and the insulating layer and by the third gate dielectric comprising a second portion of both the dielectric layer and the insulating layer.

12. A method for making an integrated circuit using a semiconductor substrate and for operating the integrated circuit, comprising:
forming a first dielectric layer over a first region of the substrate;
forming a second dielectric layer over a second region and third region of the substrate, wherein the second dielectric layer is thicker than the first dielectric layer;
forming a first gate over the first region and on the first dielectric layer;
forming a second gate over the second region and on the second dielectric layer;
forming a third gate over the third region and on the second dielectric layer;
masking the third region;
performing a first source/drain extension implant into the first region and the second region while masking the third region;
masking the first region and the second region;
performing a second source/drain extension implant into the third region while masking the first region and the second region;
completing forming a first transistor that includes the first gate, a second transistor that includes the second gate, and a third transistor that includes the third gate;
forming a logic circuit using the first transistor having a connection to a first power supply terminal;
using the second transistor to couple the logic circuit to the first power supply terminal during a power-up mode of the integrated circuit and decouple the logic circuit from the first power supply terminal during a power-down mode of the integrated circuit; and using the third transistor to interface externally to the integrated circuit.

13. The method of claim 12, further comprising:
masking the third region;
performing a first halo implant on the first and second regions while masking the third region.

14. The method of claim 13, further comprising performing a second halo implant on the third region while masking the first and second regions.

15. The method of claim 14, wherein the step of performing the second halo implant is further characterized as being performed at an energy different from that in the step of performing the first halo implant.

16. The method of claim 14, wherein the step of performing the second source/drain extension implant is further characterized as being performed at a higher energy than the first source/drain extension implant.

17. The method of claim 16 further comprising:
masking the second and third regions;
performing a first well implant into the first region while masking the second and third regions;
masking the first region; and
performing a second well implant into the second and third regions while masking the first region.

18. The method of claim 17, further comprising:
simultaneously performing a source/drain implant into the first, second, and third regions using the first gate, second gate, and third gate as masks.

* * * * *